(12) United States Patent
Ootouge

(10) Patent No.: US 6,920,403 B2
(45) Date of Patent: Jul. 19, 2005

(54) POWER SUPPLY VOLTAGE FLUCTUATION ANALYZING METHOD

(75) Inventor: Kazuo Ootouge, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 17 days.

(21) Appl. No.: 10/420,753

(22) Filed: Apr. 23, 2003

(65) Prior Publication Data

US 2003/0204340 A1 Oct. 30, 2003

(30) Foreign Application Priority Data

Apr. 24, 2002 (JP) ........................................ 2002-121560

(51) Int. Cl.[7] .............................................. G06F 19/00
(52) U.S. Cl. ............................... 702/60; 702/57; 716/1; 716/4; 365/226; 365/227
(58) Field of Search .......................... 702/60, 57; 716/1, 716/4; 365/226, 227

(56) References Cited

U.S. PATENT DOCUMENTS 5,553,008 A * 9/1996 Huang et al. ................. 703/14
6,247,162 B1 * 6/2001 Fujine et al. ................. 716/2
6,253,354 B1 * 6/2001 Kuwano et al. ............... 716/4
6,330,703 B1 * 12/2001 Saito et al. ................... 716/4

FOREIGN PATENT DOCUMENTS

JP             3054109      4/2000
JP             2000-99561   4/2000

* cited by examiner

Primary Examiner—John Barlow
Assistant Examiner—Anthony T. Dougherty
(74) Attorney, Agent, or Firm—Young & Thompson

(57) ABSTRACT

There is provided a power supply voltage fluctuation analyzing method which performs power supply voltage fluctuation analysis for a semiconductor product, and the method comprises a step of determining a power consumption distribution in each function cell of the semiconductor product by using a power supply portion position and a ratio of each portion based on stored information of an input library which stores therein the power supply portion position and ratio information for each function cell of the semiconductor product, and allocating a power consumption to each function cell.

9 Claims, 12 Drawing Sheets

Name Buffer5 A : LH  Y : LH ; 10nW ;
VDD : 1. 2V ; Ta : 27°C ; f : 1MHz ; tr : 10pS ; C1 : 0.007pF ;

a : (2. 0, 0. 0) (2. 0, 2. 0) (8) ;

b : (7. 6, 0. 0) (7. 6, 2. 0) (12) ;

c : (12. 0, 0. 0) (12. 0, 2. 0) (20) ;

d : (13. 3, 0. 0) (13. 3, 2. 0) (20) ;

e : (14. 7, 0. 0) (14. 7, 2. 0) (20) ;

f : (15. 0, 0. 0) (15. 0, 2. 0) (20) ;

end Buffer5

FIG. 2

POWER SUPPLY VOLTAGE FLUCTUATION ANALYZING METHOD

BACKGROUND OF THE INVENTION (i) Field of the Invention

The present invention relates to a power supply voltage fluctuation analyzing method, and more particularly to a current source defining method used in a power supply voltage fluctuation analyzing method for a semiconductor product.

(ii) Description of the Related Art

Conventionally, as shown in FIG. 10, this type of power supply voltage fluctuation analysis apparatus is constituted by a cell power consumption library 1a, an arranged wiring library 2, a cell connection information with arrangement position information library 3, an operating frequency library 4, reference wiring capacity extracting means 5, a wiring capacity library 6, wiring length extracting means 7, a wiring length library 8, power consumption calculating means 9, a power consumption library 10, cell size extracting means 11a, a cell size library 12a, cell area dividing means 13a, a division number library 14a, a divided area library 15a, power consumption dividing means 16, a divided power consumption library 17, power consumption allocating means 18, current source converting means 19, a current source information library 20, wiring resistance information extracting means 21, a resistance value library 22, arrangement position information extracting means 23, an arrangement position library 24, power supply voltage fluctuation value calculating means 25, a power supply voltage fluctuation library 26, and power supply designing means 27. It is to be noted that each of the above-described means can be also realized by software.

The cell power consumption library 1a stores therein information which defines a power or a current of entire each function cell calculated in accordance with an operating state of each cell (a state of an input/output signal, a power supply voltage, a temperature, a frequency, input waveform deterioration, a load capacity) in advance.

The arranged wiring library 2 stores therein information which defines a resistance value capacity value of each wiring layer/via. The cell connection information with arrangement position information library 3 stores therein information which defines arrangement position information/circuit connection information of each cell. The operating frequency library 4 stores therein information which defines an operating frequency of each cell.

The reference wiring capacity extracting means 5 extracts a unit capacity in each wiring layer/via from the stored information of the arranged wiring library 2, and the wiring capacity library 6 stores therein information of the unit capacity in each wiring layer/via outputted from the reference wiring capacity extracting means 5.

The wiring length extracting means 7 extracts a layer used in each wiring and its length from the stored information of the cell connection information with arrangement position information library 3, and the wiring length library 8 stores therein information of the layer used in each layer and its length outputted from the wiring length extracting means 7.

The power consumption calculating means 9 calculates a power consumption of each cell from information respectively stored in the cell power consumption library 1a, the operating frequency library 4, the wiring capacity library 6 and the wiring length library 8, and the power consumption library 10 stores therein information of the power consumption outputted from the power consumption calculating means 9.

The cell size extracting means 11a extracts a cell size of each cell from the stored information of the arranged wiring library 2, and the cell size library 12a stores therein information of the cell size outputted from the cell size extracting means 11a.

The cell area dividing means 13a divides an area of the cell based on the cell size stored in the cell size library 12a, the division number library 14a stores therein a division number of the cell size outputted from the cell area dividing means 13a, and the divided area library 15a stores therein information of the area of the cell outputted from the cell area dividing means 13a.

The power consumption dividing means 16 divides the power consumption based on the stored information of the power consumption library 10 and the division number library 14a, and the divided power consumption library 17 stores therein information of the power consumption divided by the power consumption dividing means 16.

The power consumption allocating means 18 performs allocation of the power consumption based on the stored information of the divided area library 15a and the divided power consumption library 17, and the current source converting means 19 converts each power consumption value allocated by the power consumption allocating means 18 into a current source. The current source information library 20 stores therein current source information outputted from the current source converting means 19.

The wiring resistance information extracting means 21 extracts a resistance value of each wiring layer/via from the stored information of the arranged wiring library 2, and the resistance value library 22 stores therein information of the resistance value outputted from the wiring resistance information extracting means 21.

The arrangement position information extracting means 23 extracts arrangement position information of each cell from the stored information of the cell connection information with the arrangement position information library 3, and the arrangement position library 24 stores therein information of the arrangement position outputted from the arrangement position information extracting means 23.

The power supply voltage fluctuation value calculating means 25 calculates a power supply voltage fluctuation value from the information respectively stored in the current source information library 20, the resistance value library 22 and the arrangement position library 24, and the power supply voltage fluctuation library 26 stores therein the power supply voltage fluctuation value outputted from the power supply voltage fluctuation value calculating means 25. The power supply designing means 27 adjusts a width and a gap of each power supply wiring based on the stored information of the power supply voltage fluctuation library 26.

The above-described power supply voltage fluctuation analysis apparatus adopts a method that information of a power supply portion is not provided in the cell power consumption library 1 defining a power consumption (current) of each cell and division and allocation of the power consumption are based on a cell size rather than the power supply portion, and the current source defining method uses a unit of cell rather than that of power supply portion.

As this current source defining method, as disclosed in Japanese patent application laid-open No. 099561/2000, there is a current source defining method for each cell in which one current source is provided for one function cell (which will be determined as a first conventional example hereinafter). In this method, the current source sorting is not effected in the function cell.

FIG. 11 shows the current source defining method carried out in the first conventional example. In FIG. 11, function cells 52, 53, 54, 55, 56 and 57 are connected to a VDD line 51, and current sources 58, 59 and 60 are defined for the function cells 54, 55 and 56 which are illustrated as an example, respectively.

Further, as another current source defining method, as disclosed in Japanese patent application laid-open No. 73436/1999, there is a current source defining method that one current source is used with respect to one function cell (which will be determined as a second conventional example hereinafter).

FIG. 12 shows a current source defining method carried out in the second conventional example. In FIG. 12, average currents flowing through circuit blocks 61, 62, 63 and 64 arranged between a VDD line having a plurality of resistances R and a GND line are defined as I61, I62, I63 and I64, respectively. R in FIG. 12 is determined based on a sheet resistance ρs in the wring, a wiring width W and a wiring length L0.

Since the power supply voltage fluctuation analyzing method using such a current source defining method recognizes that the current in the function cell is concentrated on one position of connection points of the current source defined in analysis and the VDD and GND lines, there occurs a problem that the current paths are not dispersed and the power supply voltage fluctuation value becomes larger than an actual value. Since the power consumption is increasing due to realization of a larger scale, higher integration and a higher speed of semiconductor products in recent years and fluctuations in the power supply voltage largely affects the performance of the products, the difficulty in power supply design becomes higher, and improvement in the analysis accuracy is demanded.

In order to fulfill this demand, there is, e.g., a power supply voltage fluctuation analyzing tool "Star-Rail" manufactured by Avant! (which will be determined as a third conventional example hereinafter). FIG. 13 shows a current source defining method carried out in this third conventional example.

In FIG. 13, there are provided first layer lateral VDD lines 71, 73, 75 and 77, first layer lateral GND lines 72, 74 and 76, second layer vertical VDD lines 78 and 80 and second layer vertical GND layers 79 and 81 in an area 70 of an LSI (Large-Scale Integration), and the VDD lines and the GND lines of the first layer and the second layer are connected to each other at respective intersections.

On the other hand, function cells 82, 83, 84, 85, 86, 87, 88, 89 and 90 are arranged in the area 70. Description will be given as to the current source defining method in the function cell 90 among these function cells as an example.

An area which is determined based on dimensions of the function cell 90 in an X direction and a Y direction and in which the function cell 90 is arranged is divided by a fixed dimension, and the entire power consumption is divided by that division number. The divided power consumption values are evenly allocated to all of the divided areas. In this third conventional example, the current source is defined for all of the areas divided with respect to one function cell.

In the above-described power supply voltage fluctuation analysis apparatus, since the number of the current source defined in one function cell is one in the case of the technique disclosed in the first conventional example illustrated in FIG. 11 and the case of the technique disclosed in the second conventional example depicted in FIG. 12, there is no structure that the current source is defined for each power supply source in the function cell.

Furthermore, in case of the technique disclosed in the third conventional example depicted in FIG. 13, there is no structure that the current source is defined for each power supply source like the first conventional example and the second conventional example.

Therefore, when analyzing the power supply voltage fluctuation using the first conventional example and the second conventional example, since the apparatus recognizes that the current in the function cell is concentrated on one position of the connection points of the defined current source and the VDD and GND lines, there occurs a problem that the current paths are not dispersed and the power supply fluctuation value becomes larger than an actual value.

Moreover, when performing the power supply voltage fluctuation analysis using the third conventional example, in a function such as an SRAM (Static Random Access Memory) whose area is larger than that of a basic function cell such as a NAND (NAND gate) and which is arranged so as to extend over a plurality of power supply lines, the power consumption distribution in the function generally becomes uneven. However, there is adopted the power consumption division method that the power consumption distribution becomes even in the entire area where the function cell is arranged, thereby resulting in an operation that an operating current is equally divided between a plurality of the VDD lines running through the function cell.

For example, as shown in FIG. 13, in the function cell 90, the VDD lines 78 and 80 in the vertical direction of the second layer have the equal quantity of supply current. As a result, an inverter with a larger power consumption (inverter or the like which drives a signal line with a large capacity value) is configured in the vicinity of the intersection of the VDD lines 77 and 80 in the function cell 90. Even if the power consumption distribution is biased in the cell, a difference cannot be made between values of the currents flowing through the VDD lines 78 and 80 in the third conventional example, and hence there is a problem that the bias of the power consumption distribution in the function cell cannot be reflected to the power supply design.

In addition, since the current source defining method in the third conventional example adopts the power consumption dividing method depending on a cell area, the division number becomes higher as an area of the function cell increases, and many current sources must be processed during the power supply voltage fluctuation analysis, thereby resulting in a problem that a calculation amount is increased.

SUMMARY OF THE INVENTION

According to the present invention, there is provided a power supply voltage fluctuation analyzing method which performs power supply voltage fluctuation analysis of a semiconductor product, the method comprising a step of determining a power consumption distribution in a cell of a semiconductor product by using a position of a power supply portion and a ratio of each portion based on stored information of an input library which stores therein the position of the power supply portion and ratio information for each function cell of the semiconductor product, and allocating the power consumption to each cell.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 2 is a view showing a structure of a cell power consumption library depicted in FIG. 1;

DETAILED DESCRIPTION OF THE INVENTION

Figure 1:
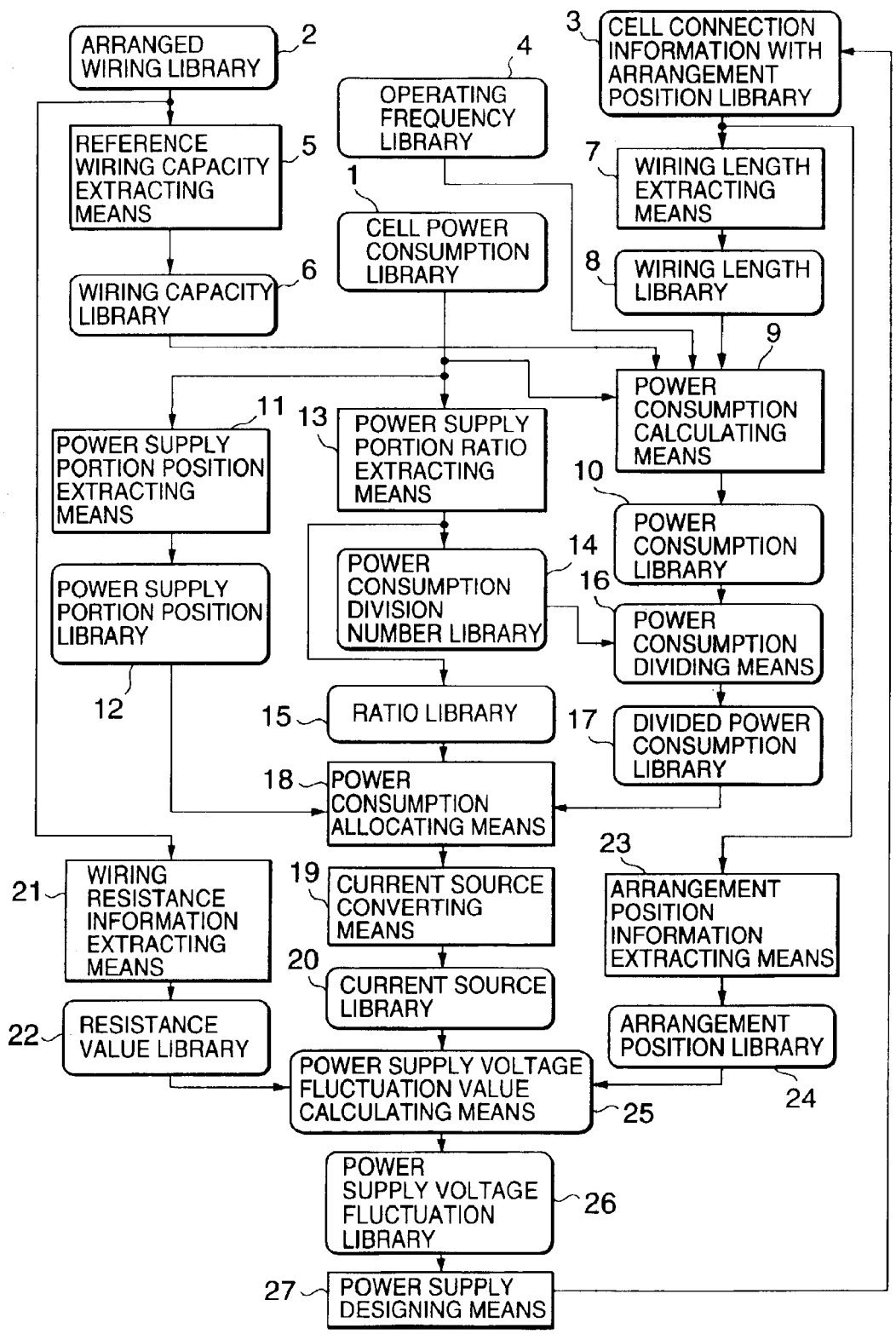
FIG. 1 is a block diagram showing a structure of a power supply voltage fluctuation analysis apparatus according to a first embodiment of the present invention.

Preferred embodiments according to the present invention will now be described with reference to the accompanying drawing. FIG. 1 is a block diagram showing a structure of a power supply voltage fluctuation analysis apparatus according to a first embodiment of the present invention. In FIG. 1, the power supply voltage fluctuation analysis apparatus according to the first embodiment of the present invention is constituted by a cell power consumption library 1, an arranged wiring library 2, a cell connection information with arrangement position information library 3, an operating frequency library 4, reference wiring capacity extracting means 5, a wiring capacity library 6, wiring length extracting means 7, a wiring length library 8, power consumption calculating means 9, a power consumption library 10, power supply portion position extracting means 11, a power supply portion position library 12, power supply portion ratio calculating means 13, a power consumption division number library 14, a ratio library 15, power consumption dividing means 16, a divided power consumption library 17, power consumption allocating means 18, current source converting means 19, a current source library 20, wiring resistance information extracting means 21, a resistance value library 22, arrangement position information extracting means 23, an arrangement position library 24, power supply voltage fluctuation value calculating means 25, a power supply voltage fluctuation library 26, and a power supply designing means 27. It is to be noted that the respective means excluding the libraries can be also realized by software, i.e., a program executed on a computer and, in such a case, the respective means can be represented as steps.

The cell power consumption library 1 stores therein information which defines a power or a current of entire each function cell calculated in advance in accordance with an operating state of each cell (a state of an input/output signal, a power supply voltage, a temperature, a frequency, an input waveform deterioration, a load capacity), a power supply portion metal wiring position in each MOSFET (Metal Oxide Semiconductor Field Effect Transistor) in the cell, and ratio information.

The arranged wiring library 2 stores therein information which defines a resistance value capacity value of each wiring layer/via. The cell connection information with arrangement position information library 3 stores therein information which defines arrangement position information/circuit connection circuit of each cell. The operating frequency library 4 stores therein information which defines an operating frequency of each cell.

The reference wiring capacity extracting means 5 extracts a unit capacity in each layer/via from the stored information of the arranged wiring library 2, and the wiring capacity library 6 stores therein information of the wiring capacity outputted from the reference wiring capacity extracting means 5.

The wiring length extracting means 7 extracts a layer used in each wiring and its length from the stored information of the cell connection information with arrangement position information library 3, and the wiring length library 8 stores therein information of a wiring length outputted from the wiring length extracting means 7.

The power consumption calculating means 9 calculates a power consumption of each cell based on the information respectively stored in the cell power consumption library 1, the operating frequency library 4, the wiring capacity library 6 and the wiring length library 8, and the power consumption library 10 stores therein information of the power consumption outputted from the power consumption calculating means 9.

The power supply portion position extracting means 11 extracts power supply portion position information of each cell from the stored information of the cell power consumption library 1, and the power supply portion position library 12 stores therein information of the power supply portion position outputted from the power supply portion position extracting means 11.

The power supply portion ratio calculating means 13 extracts power supply portion ratio information from the stored information of the cell power consumption library 1 and calculates a division number of the power supply portion and each ratio, and the power consumption division number library 14 stores the power consumption division number outputted from the power supply portion ratio calculating means 13, and the ratio library 15 stores information of the ratio of the power supply portion outputted from the power supply portion ratio calculating means 13.

The power consumption dividing means 16 divides a power consumption based on the respective stored information of the power consumption library 10 and the power consumption division number library 14, and the divided power consumption library 17 stores therein information of the divided power consumption outputted from the power consumption dividing means 16.

The power consumption allocating means 18 allocates the power consumption based on the information respectively stored in the power supply portion position library 12, the ratio library 15 and the divided power consumption library 17, and the current source converting means 19 converts each allocated power consumption value into a current source. The current source library 20 stores therein information of the current source outputted from the current source converting means 19.

The wiring resistance information extracting means 21 extracts a resistance value of each wiring layer/via from the stored information of the arranged wiring library 2, and the resistance value library 22 stores therein information of the resistance value outputted from the wiring resistance information extracting means 21.

The arrangement position information extracting means 23 extracts arrangement position information of each cell from the stored information of the cell connection information with cell connection information library 3, and the arrangement position library 24 stores therein information of the arrangement position outputted from the arrangement position information extracting means 23.

The power supply voltage fluctuation value calculating means 25 calculates a power supply voltage fluctuation value from the information respectively stored in the current source library 20, the resistance value library 22 and the arrangement position library 24, and the power supply voltage fluctuation library 26 stores therein the power supply voltage fluctuation value outputted from the power supply voltage fluctuation value calculating means 25. The power supply designing means 27 adjusts a width and a gap of each power supply wiring based on the power supply voltage fluctuation value stored in the power supply voltage fluctuation library 26.

FIG. 2 is a view showing a structure of the cell power consumption library 1 illustrated in FIG. 1. FIG. 2 depicts a structural example of the cell power consumption library 1 according to the first embodiment of the present invention. The cell power consumption library 1 stores each cell name, each condition when calculating a power consumption (a state of an input/output signal, a power supply voltage, a temperature, a frequency, an input waveform deterioration, a load capacity) and an entire power consumption, and it is constituted by a ratio of power consumed in accordance with each MOSFET in the cell and positional information of its power supply portion metal wiring.

The power supply potion position extracting means 11, the power supply portion ratio calculating means 13, the cell power consumption library 1, the power supply portion position library 12, the power consumption division number library 14 and the ratio library 15 convert the power consumption library and store values in such a manner that the current source defining method in power supply voltage fluctuation value analysis can be defined for the power supply portion metal wiring in the cell.

The arranged wiring library 2, the cell connection information with arrangement position information library 3, the operating frequency library 4, the reference wiring capacity extracting means 5, the wiring capacity library 6, the wiring length extracting means 7, the wiring length library 8, the power consumption calculating means 9, the power consumption library 10, the power consumption dividing means 16, the divided power consumption library 17, the power consumption allocating means 18, the current source converting means 19, the current source library 20, the wiring resistance information extracting means 21, the resistance value library 22, the arrangement position information extracting means 23, the arrangement position library 24, the power supply voltage fluctuation value calculating means 25, the power supply voltage fluctuation library 26 and the power supply designing means 27 are well known to persons skilled in the art and they do not directly concern the present invention. Thus, illustration and description of their detailed structures will be eliminated.

Figure 3A:
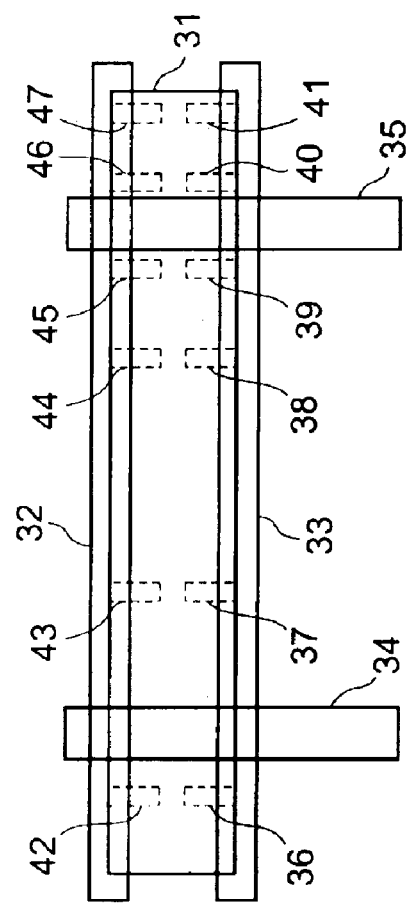
FIG. 3A is a view showing a circuit example used in the first embodiment of the present invention.

FIG. 3A is a view showing a circuit example used in the first embodiment according to the present invention. An operation of the power supply voltage fluctuation analysis apparatus according to the first embodiment of the present invention will be described hereinafter with reference to FIGS. 1, 2 and 3A. First, description will be given as to the operation of the power supply portion position extracting means 11 which is illustrated in FIG. 1 and extracts the power supply portion position information with reference to a layout drawing of FIG. 3A.

In FIG. 3A, there are provided a first layer lateral GND line 33, a first layer lateral VDD line 32 and second layer vertical GND lines 34 and 35, and the GND line 33 is connected to each of the second layer vertical GND lines 34 and 35.

To a function cell 31 are provided power supply portion metal wirings 36, 37, 38, 39, 40 and 41 of an N channel MOSFET and power supply portion metal wirings 42, 43, 44, 45, 46 and 47 of a P channel MOSFET.

In the cell power consumption library 1 depicted in FIG. 2, there are defined an operating state of each cell (a state of an input/output signal, a power supply voltage, a temperature, a frequency, an input waveform deterioration, a load capacity), a power of entire each function cell calculated in advance in accordance with that operating state, a power supply portion position in each MOSFET in the cell and ratio information.

For example, the power consumption of an inverter constituted in the function cell 31 having a power supply portion 36 of the N channel MOSFET and a power supply portion 42 of the P channel MOSFET is expressed in terms of a ratio of the power consumption calculated from arrangement coordinates of the power supply portion metal wirings 36 and 42 and a quantity of currents flowing through the power supply portion metal wirings 36 to 42 in the entire function cell 31 as indicated by a in FIG. 2.

Therefore, the power supply portion position information extracting means 11 illustrated in FIG. 1 extracts only positional information (coordinates) from the cell power consumption library 1 and stores it in the power supply portion position library 12.

The power supply portion ratio calculating means 13 which extracts the power supply portion ratio information extracts ratio information of each power supply portion defined in the cell power consumption library 1, determines an entire power consumption division number from a minimum unit of the ratio, and stores it in the power consumption division number library 14. The ratio of each power supply portion is stored in the ratio library 15.

In addition, the stored information of the cell power consumption library 1 is inputted to the power consumption calculating means 9 together with the respective information stored in the operating frequency library 4, the wiring capacity library 6 and the wiring length library 8, and a calculation result of the power consumption is stored in the power consumption library 10.

When the calculation result of the power consumption is stored, the power consumption library 10 inputs the stored information thereof to the power consumption dividing means 16 together with the stored information of the power consumption division number library 14, and a division result of the power consumption divided by the power consumption dividing means 16 is stored in the divided power consumption library 17.

The stored information of the power supply portion library 12 is inputted to the power consumption allocating means 18 together with the respective stored information of the ratio library 15 and the divided power consumption library 17, and the power consumption is allocated for each power supply portion position.

Figure 10:
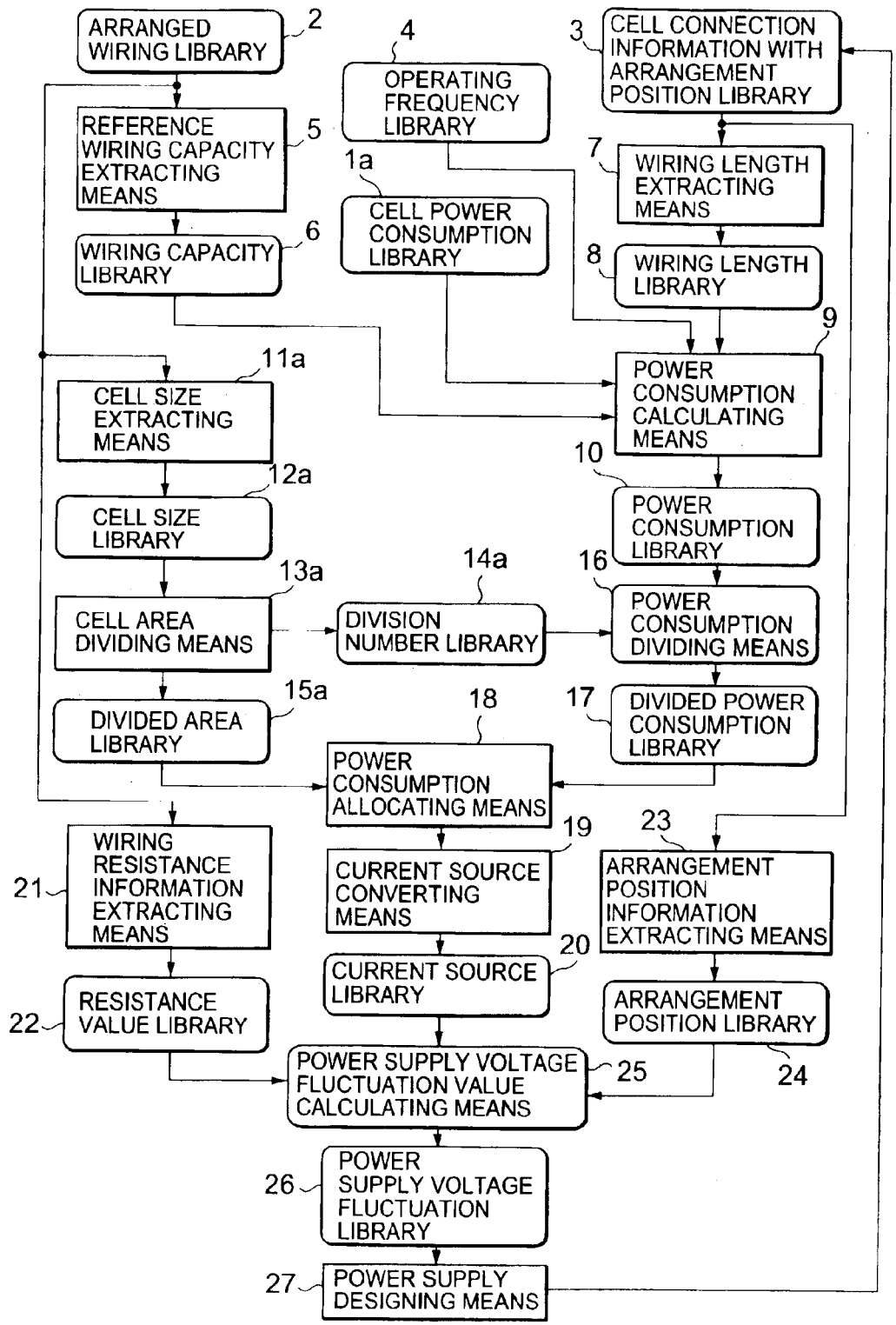
FIG. 10 is a block diagram showing a structure of a conventional power supply voltage fluctuation analysis apparatus.
Figure 11:
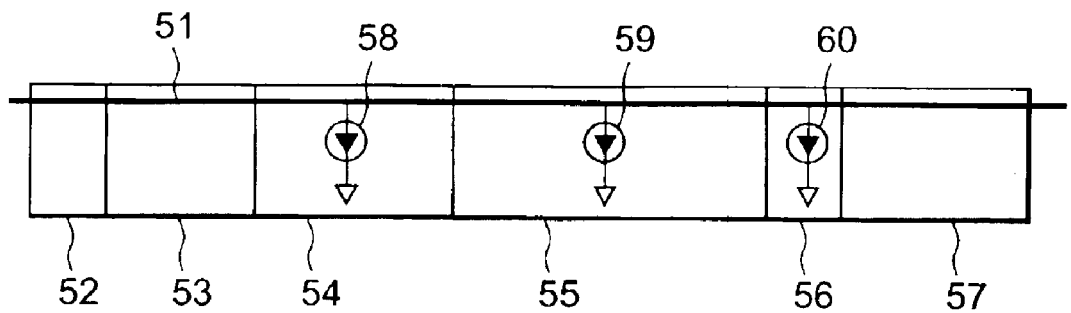
FIG. 11 is a view showing an example of a conventional current source defining method.
Figure 12:
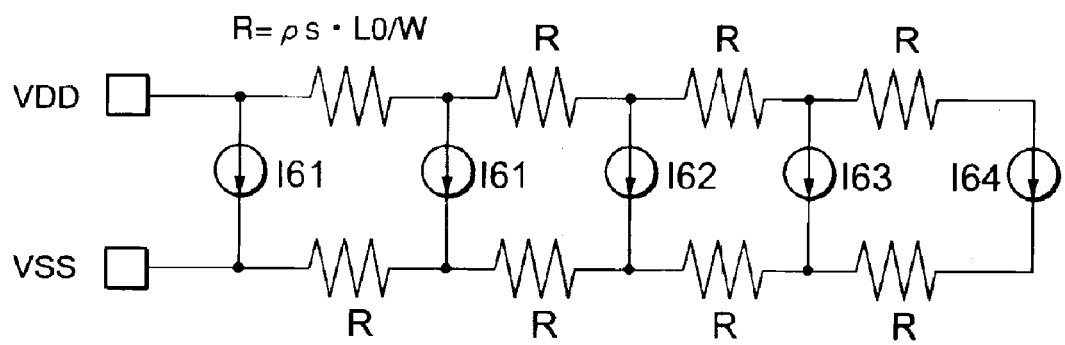
FIG. 12 is a view showing another example of the conventional current source defining method.
Figure 13:
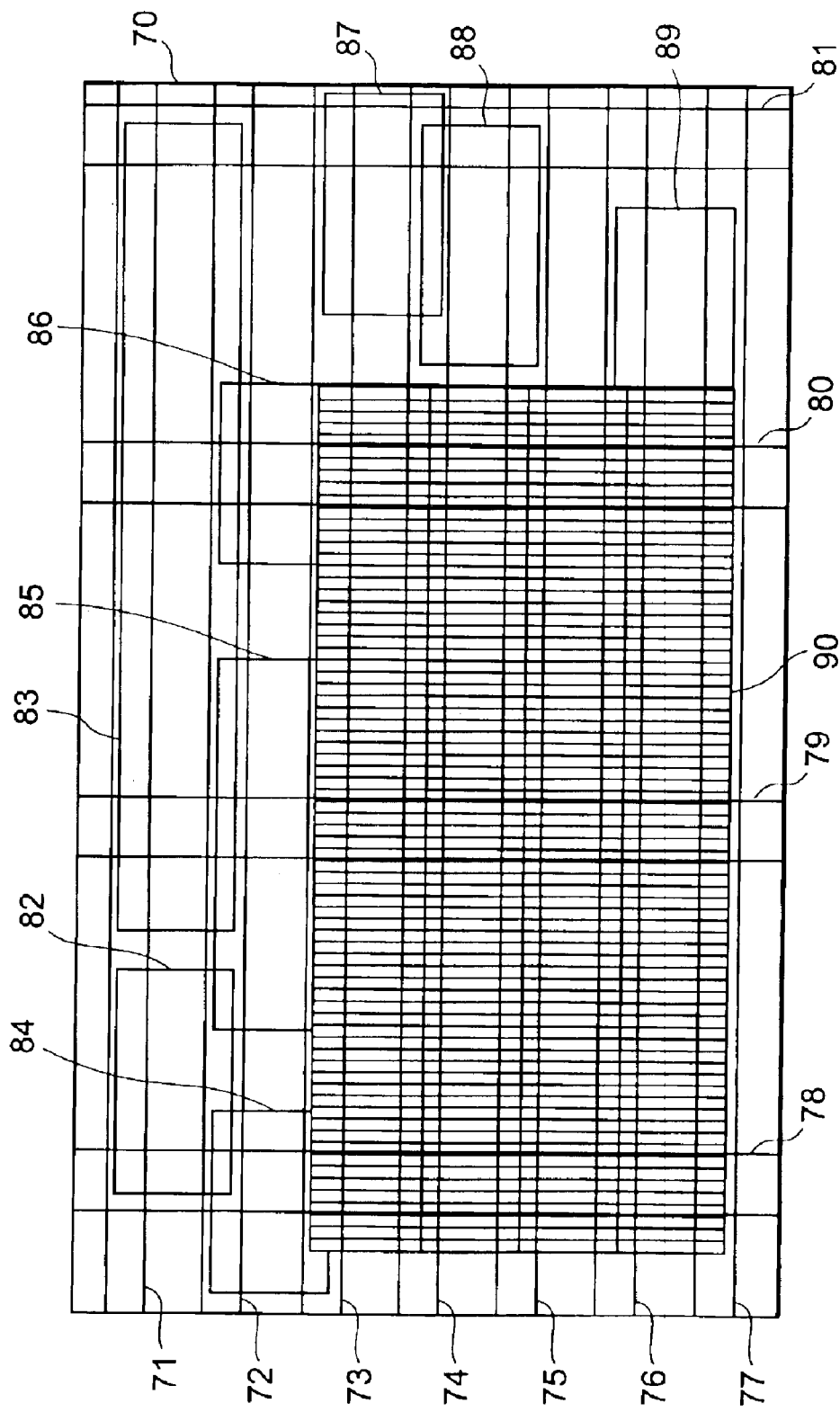
FIG. 13 is a view showing still another example of the conventional current source defining method.

Any other operation than the above-described operation is the same as that of the power supply voltage fluctuation apparatus according to the conventional example shown in FIG. 10.

As described above, since the first embodiment according to the present invention defines the current source according to the operating state of each of the power supply portion metal wirings 36, 37, 38, 39, 40 and 41 of the N channel MOSFET and the power supply portion metal wirings 42, 43, 44, 45, 46 and 47 of the P channel MOSFET provided in the function cell 31 shown in FIG. 3A, it is possible to recognize a difference in value of the currents flowing through the second layer vertical GND lines 34 and 35 running through the function cell 31 during the power supply voltage fluctuation analysis, and this can be reflected to an analysis result.

Figure 3B:
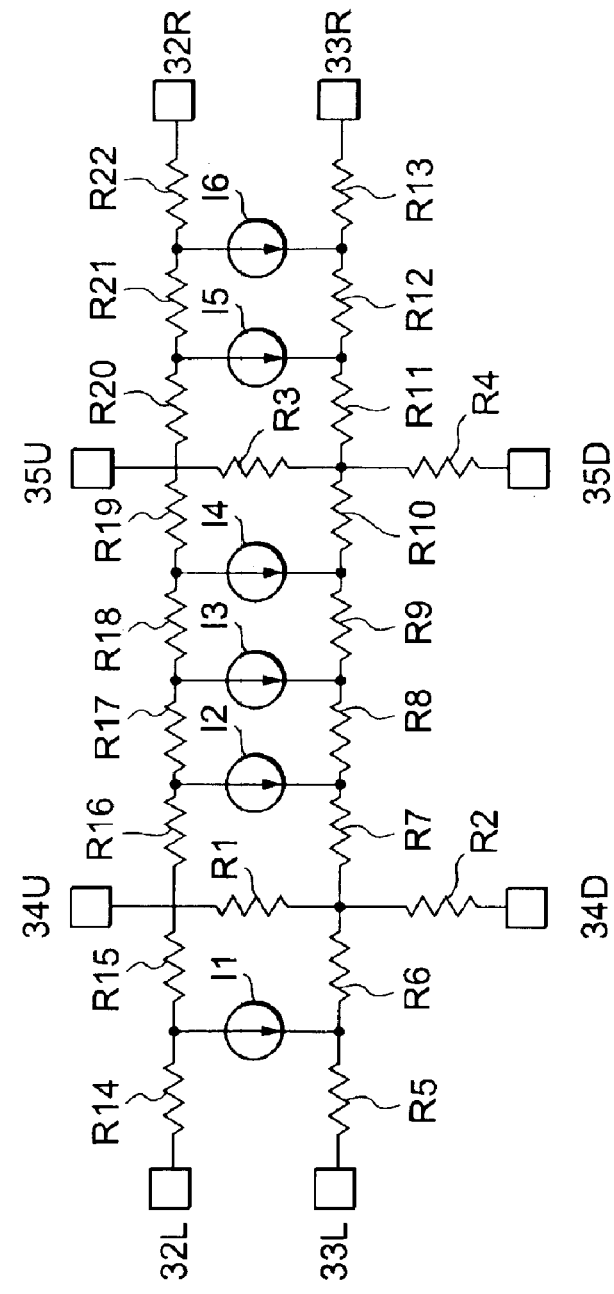
FIG. 3B is a view showing an equivalent circuit of 3A.

FIG. 3B is a view showing the current sources and the resistances in an equivalent circuit. In FIG. 3B, the equivalent circuit has a current source I1 which represents a quantity of current flowing through the power supply portion metal wirings 36 to 42, a current source I2 which represents a quantity of current flowing through the power supply portion metal wirings 37 to 43, a current source I3 which represents a quantity of current flowing through the power supply portion metal wirings 38 to 44, a current source I4 which represents a quantity of current flowing through the power supply portion metal wirings 39 to 45, a current source I5 which represents a quantity of current flowing through the power supply portion metal wirings 40 to 46, a current source I6 which represents a quantity of current flowing through the power supply portion metal wirings 41 to 47, resistances R1 and R2 and their connection points 34U and 34D of respective parts in the second layer vertical GND line 34, resistances R3 and R4 and their connection points 35U and 35D of respective parts in the second layer vertical GND line 35, resistances R5, R6, R7, R8, R9, R10, R11, R12 and R13 and their connection points 33L and 33R of respective parts in the first layer lateral GND line 33, and resistances R14, R15, R16, R17, R18, R19, R20, R21 and R22 and their connection points 32L and 32R of respective parts in the first layer lateral direction VDD line 32.

In this embodiment, since the current sources I1, I2, I3, I4, I5 and I6 which have fixed ratios are defined in coordinates of the connection points to the VDD lines and GND lines of the respective current sources extracted from FIG. 2, it is possible to recognize a difference in value between currents flowing through the resistances R2 and R4 during the power supply voltage fluctuation analysis, thereby reflecting a difference in fluctuated voltage value between the connection points 34D and 35D to an analysis result.

Therefore, since a fluctuated voltage value of the second layer vertical GND line 34 is different from that of the second layer vertical GND line 35, a wiring width can be changed in the power supply design, and the power supply line width and gap can be optimized by adjusting the current density of the GND line.

Further, this embodiment adopts the method which defines the current source only in the power supply portion in each MOSFET in the function cell, the current source is not defined in an area where MOSFET does not exist, thereby reducing the number of definitions of the current sources. Accordingly, the number of elements to be processed is reduced in accordance with the number of definitions of the current sources, thus obtaining the advantage of decreasing a calculation amount during analysis.

It is to be noted that description has been given as to the case where the current source is defined with respect to the power supply portion metal wiring arrangement position in each MOSFET in this embodiment, but one current source may be defined with respect to a plurality of MOSFETs when a plurality of MOSFETs perform the operation for one time.

Furthermore, although one current source connection point is defined from the power supply portion metal wiring arrangement position in each MOSFET in this embodiment, definition of the current source may be divided into a plurality of definitions in accordance with the current density distribution in the metal wiring.

Moreover, although description has been given as to MOSFET in this embodiment, it is possible to employ the method of defining the current source in an element such as a bipolar transistor.

FIGS. 4A to D are views showing circuit examples used in a second embodiment according to the present invention. FIGS. 5A to C are views showing equivalent circuits having the circuit configurations of FIG. 4. The second embodiment according to the present invention will now be described with reference to FIGS. 4 and 5. Although the basic structure of the power supply voltage fluctuation analysis apparatus according to the second embodiment of the present invention is the same as the structure according to the first embodiment of the present invention shown in FIG. 1, the ingenuity is further exercised with respect to parts as well as the metal wirings in the method of defining positional information of the power supply portion, and a source contact arrangement coordinate system is used.

Figure 4A:
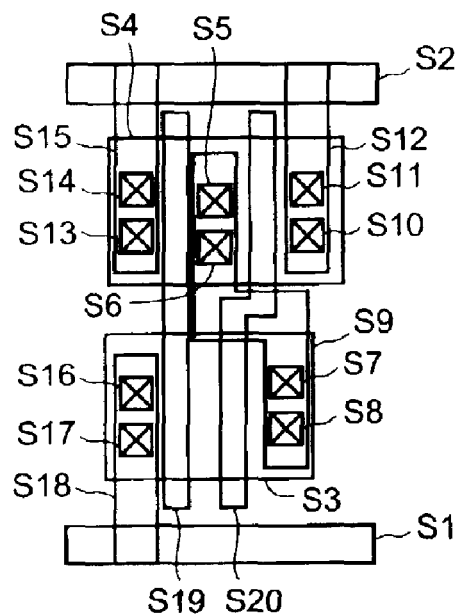
FIGS. 4A, 4B, 4C, and 4D are views respectively showing circuit examples used in a second embodiment according to the present invention.
Figure 5A:
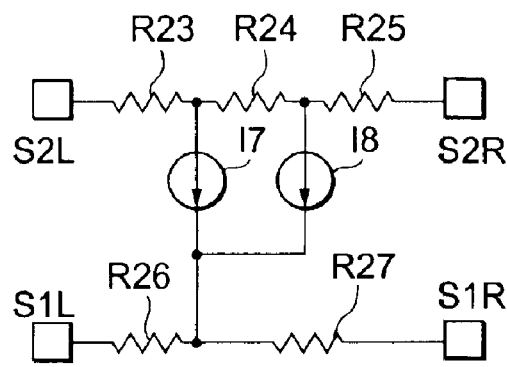
FIGS. 5A, 5B, and 5C are views respectively showing equivalent circuits of the circuit configurations in 4A, 4B, 4C, and 4D.
Figure 5B:
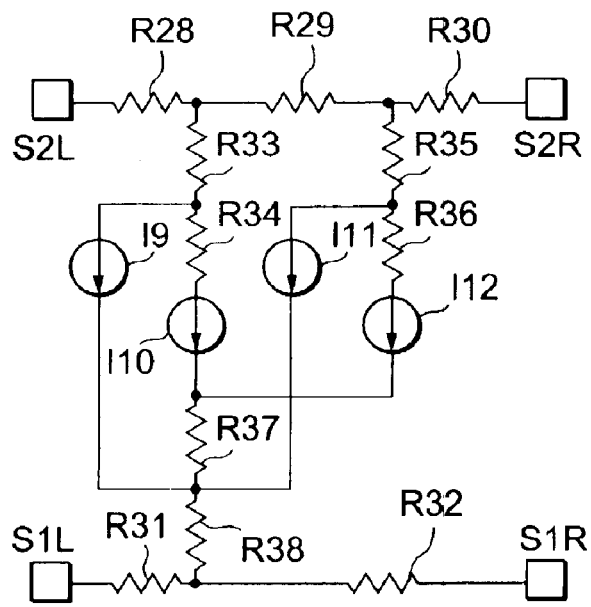
Figure 5C:
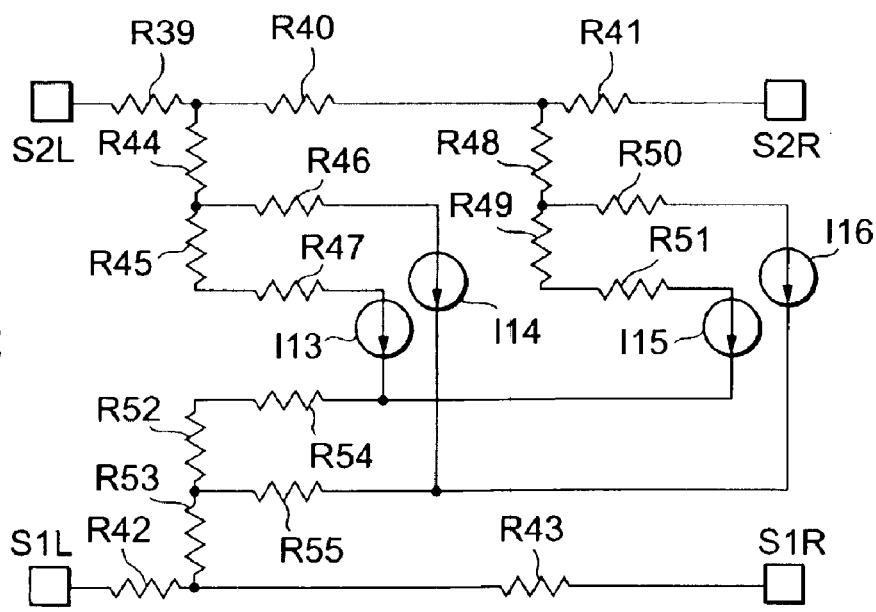

FIG. 4A is a layout drawing of an NAND gate, and this NAND gate is constituted by a first layer lateral GND line S1, a first layer lateral VDD line S2, a diffusion layer area S3 of the N channel MOSFET, a diffusion layer area S4 of the P channel MOSFET, drain contacts S5 and S6 of the P channel MOSFET, drain contacts S7 and S8 of the N channel MOSFET, a metal wiring S9 connecting the drain contacts S5 and S6 of the P channel MOSFET with the drain contacts S7 and S8 of the N channel MOSFET, source contacts S10, S11, S13 and S14 of the P channel MOSFET, a metal wiring S12 which connects the source contacts S10 and S11 of the P channel MOSFET with the first layer lateral VDD line S2, a metal wiring S15 which connects the source contacts S13 and S14 of the P channel MOSFET with the first layer lateral VDD line S2, source contacts S16 and S17 of the N channel MOSFET, a metal wiring S18 which connects the source contacts S16 and S17 of the N channel MOSFET with the first layer lateral GND line S1, and gate polysilicon S19 and S20 of the MOSFET.

Figure 4B:
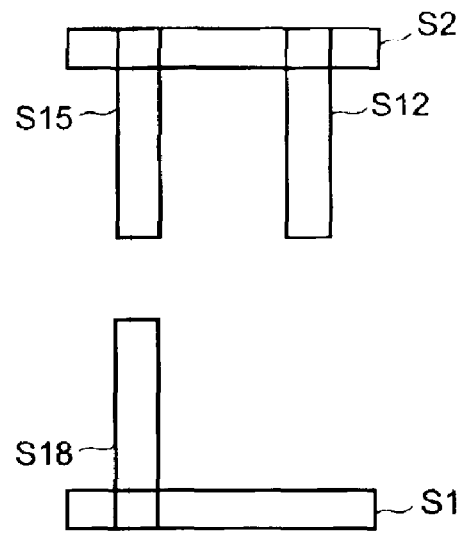

FIG. 4B is a layout drawing of the NAND gate corresponding to FIG. 3A showing the current source defining method according to the first embodiment of the present invention that the positional information of the power supply portion is described with respect to the source metal wiring of the MOSFET, and FIG. 5A shows an equivalent circuit corresponding to FIG. 3B.

FIG. 5A includes R23, R24, R25 obtained by dividing the resistance value of the VDD metal wiring S2 between the connection points S2L and S2R, R26 and R27 obtained by dividing the resistance value of the GND metal wiring S1 between the connection points S1L and S1R, and current sources I7 and I8 each having another parasitic resistance in the MOSFET as an internal resistance.

Figure 4C:
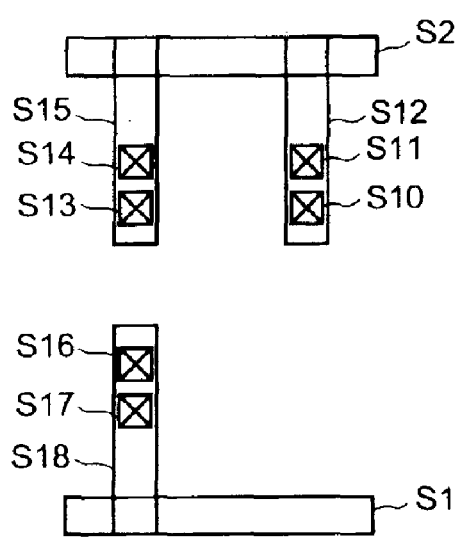

When this structure is determined as the second embodiment according to the present invention and description of the power supply portion with respect to the metal wiring is changed to that with respect to the source contact, its layout drawing is changed from FIG. 4B to FIG. 4C, and the arrangement coordinate of the source contact is determined as a connection point of the current source. Therefore, the equivalent circuit diagram is changed from FIG. 5A to FIG. 5B.

FIG. 5B includes a VDD metal wiring S2 between the connection points S2L and S2R, R28, R29, R30, R33 and R34 obtained by dividing the resistance values of the source portion metal wirings S11 and S12 of the P channel MOSFET, a GND metal wiring S1 between the connection points S1L and S1R, R31, R32, R38 and R39 obtained by dividing the resistance value of the source portion metal wiring S18 of the N channel MOSFET, and current sources I9, I10, I11 and I12 each having another parasitic resistance in the MOSFET as an internal resistance.

Therefore, in the power supply voltage fluctuation analysis using the second embodiment according to the present invention, there can be obtained an advantage that the power supply voltage fluctuation values at R33, R34, R35, R36, R37 and R38 can be also reflected.

Although the basic structure of the power supply voltage fluctuation analysis apparatus according to a third embodiment of the present invention is the same as the structure according to the first embodiment of the present invention shown in FIG. 1, the ingenuity is further exercised with respect to parts other than the source arrangement coordinate in the method of defining the positional information of the power supply portion, and a source side diffusion area is used.

Figure 4D:
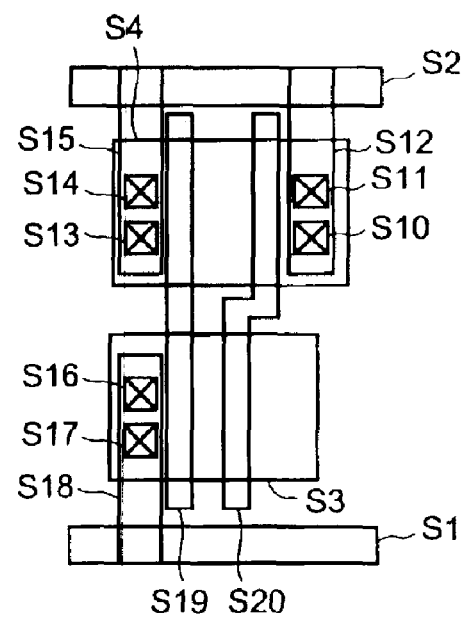

In the third embodiment, description of the power supply portion is changed from that with respect to the source contact arrangement coordinate in the second embodiment according to the present invention to that with respect to an arrangement position of the source side diffusion layer area, and its layout drawing is changed from FIG. 4C to FIG. 4D. Also, the arrangement coordinate of the source side diffusion layer area is determined as the connection point of the current source, and hence the equivalent circuit diagram is changed from FIG. 5B to FIG. 5C.

FIG. 5C is constituted by a VDD metal wiring S2 between S2L and S2R, source portion metal wirings S11 and S12 of the P channel MOSFET, R39, R40, R41, R44, R45, R46, R47, R48, R49, R50 and R51 obtained by dividing resistance values of the source contacts S10, S11, S13 and S14 of the P channel MOSFET, a GND metal wiring S1 between the connection points S1L and S1R, a source portion metal wiring S18 of the N channel MOSFET, R42, R43, R52, R53, R54 and R55 obtained by dividing resistance values of the source contacts S16 and S17 of the N channel MOSFET, and current sources I13, I14, I15 and I16 each having another parasitic resistance in the MOSFET as an internal resistance.

Therefore, there can be obtained an advantage that the power supply voltage fluctuation values at R46, R47, R50, R51, R54 and R55 can be also reflected in the power supply voltage fluctuation analysis using the third embodiment according to the present invention.

In a fourth embodiment according to the present invention, the definition of a position of the power supply portion and a ratio is stored in the arranged wiring library. The definition of the power supply portion position and the ratio information is written in the cell power consumption library shown in FIG. 2 in the first embodiment according to the present invention, the second embodiment according to the present invention and the third embodiment according to the present invention. However, as a method of defining such information in any other input file, it can be written in terminal position information or an arranged wiring prohibited position information in each function cell in the arranged wiring library.

Figure 6:
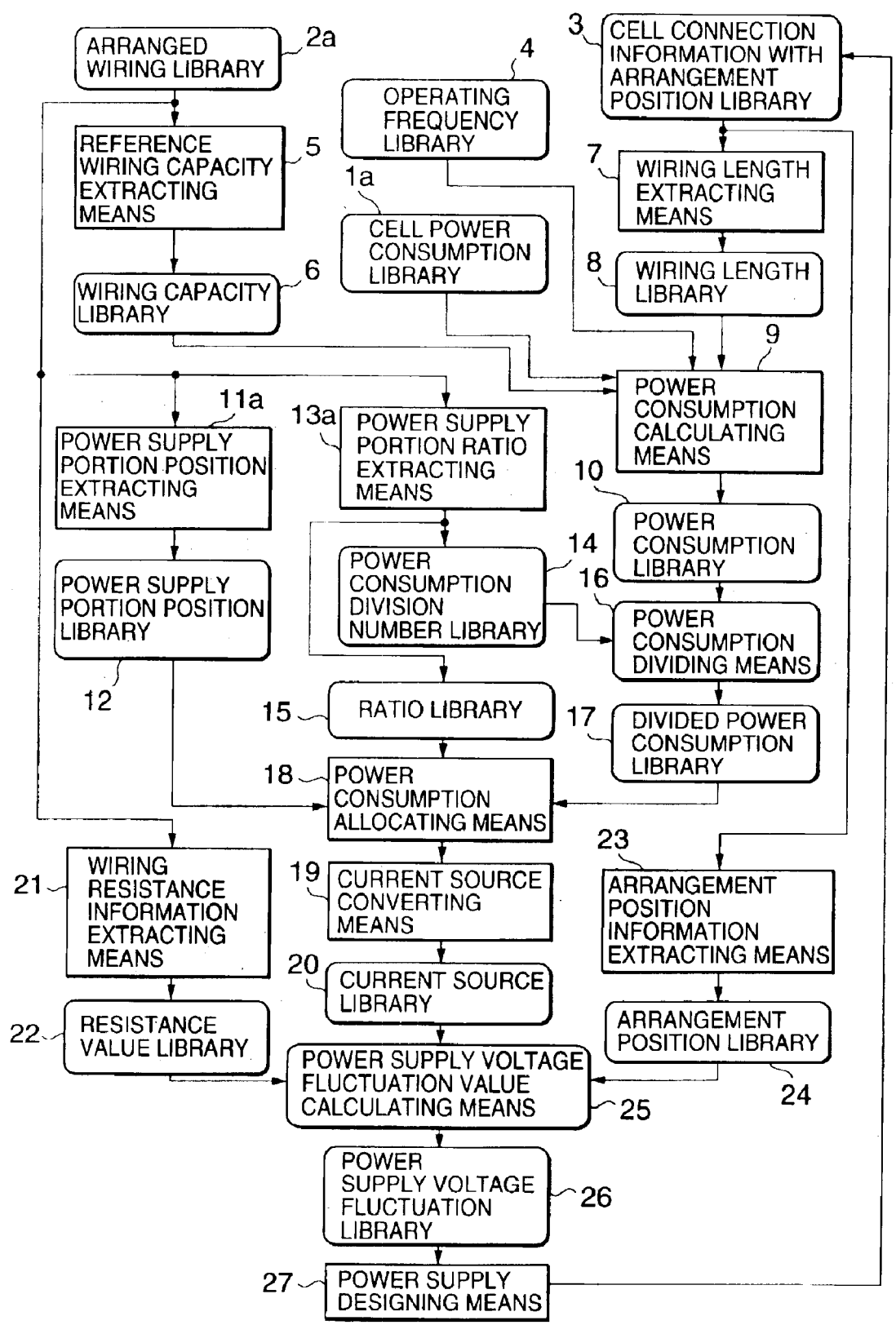
FIG. 6 is a block diagram showing a structure of a power supply voltage fluctuation analysis apparatus according to a fourth embodiment of the present invention.

FIG. 6 is a block diagram showing a structure of the power supply voltage fluctuation analysis apparatus according to a fourth embodiment of the present invention. In FIG. 6, the power supply voltage fluctuation analysis apparatus according to the fourth embodiment of the present invention is configured so as to have power supply portion position extracting means 11a for extracting positional information of the power supply portion from the arranged wiring library 2a in which a power supply portion position and ratio information are written in a coordinate definition portion for, e.g., terminal position information or arranged wiring prohibited position information and power supply portion ratio extracting means 13a for extracting the ratio information of the power supply portion from the arranged wiring library 2a, but not to have the power supply portion position and the ratio information in the cell power consumption library 1a.

In the power supply voltage fluctuation analysis apparatus according to the fourth embodiment of the present invention, any other structure than that described above is the same as the structure according to the first embodiment of the present invention, and like reference numerals denote like or corresponding parts. In addition, the operation of the same constituent element is the same as the first embodiment according to the present invention.

In the fifth embodiment according to the present invention, the definition of the power supply portion position and the ratio is written in the cell connection information with arrangement position information library. In the first embodiment according to the present invention, the second embodiment according to the present invention and the third embodiment according to the present invention, the definition of the power supply portion position and the ratio information is written in the cell power consumption library shown in FIG. 2. However, as a method of defining the same in any other input file, such a definition can be written in the terminal position information or the arranged wiring prohibited position information in each function cell in the arranged wiring library.

Figure 7:
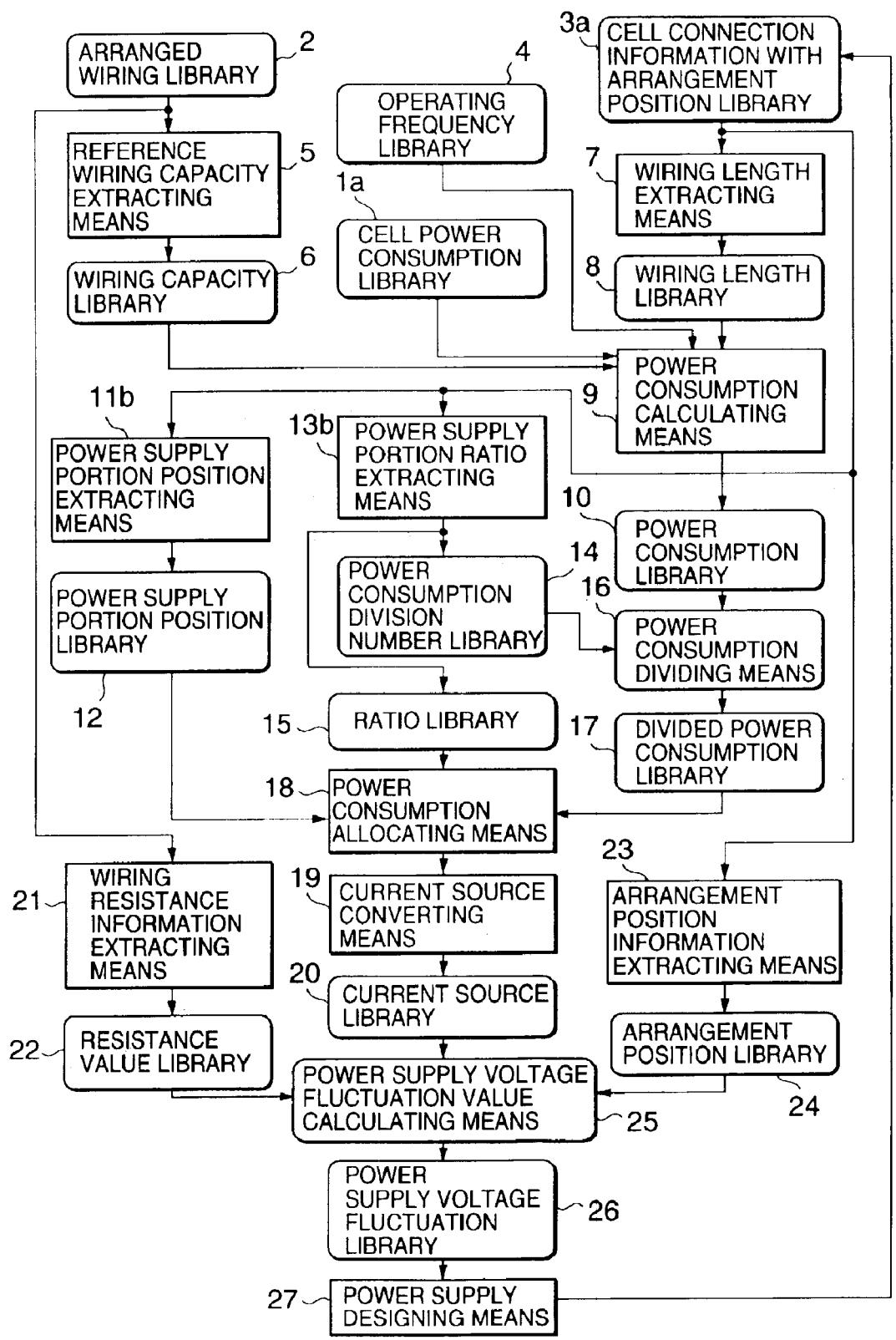
FIG. 7 is a block diagram showing a structure of a power supply voltage analysis apparatus according to a fifth embodiment of the present invention.

FIG. 7 is a block diagram showing a structure of the power supply voltage fluctuation analysis apparatus according to the fifth embodiment of the present invention. In FIG. 7, the power supply voltage fluctuation analysis apparatus according to the fifth embodiment of the present invention is configured to have power supply portion position extracting means 11b for extracting positional information of the power supply portion from the cell connection information with arrangement position information library 3a in which the power supply portion position and the ratio information are written in a coordinate definition portion for, e.g., arrangement position information and power supply portion ratio extracting means 13b for extracting the ratio information of the power supply portion from the cell connection information in the chip with arrangement position information library 3a, but not to have the power supply portion position and the ratio information stored in the cell power consumption library 1a.

In the power supply voltage fluctuation analysis apparatus according to the fifth embodiment, any other structure than that described above is the same as the structure of the first embodiment according to the present invention, and like reference numerals denote like or corresponding parts. Moreover, the operation of the same constituent element is the same as the first embodiment according to the present invention.

Although a basic structure of a sixth embodiment according to the present invention is the same as that of the first embodiment according to the present invention, it is suitable for a method used in electromigration (which will be referred to as EM hereinafter) analysis of a semiconductor product as well as power supply voltage fluctuation analysis as a method to be used to which the current source defining method according to the present invention is applied.

Figure 8:
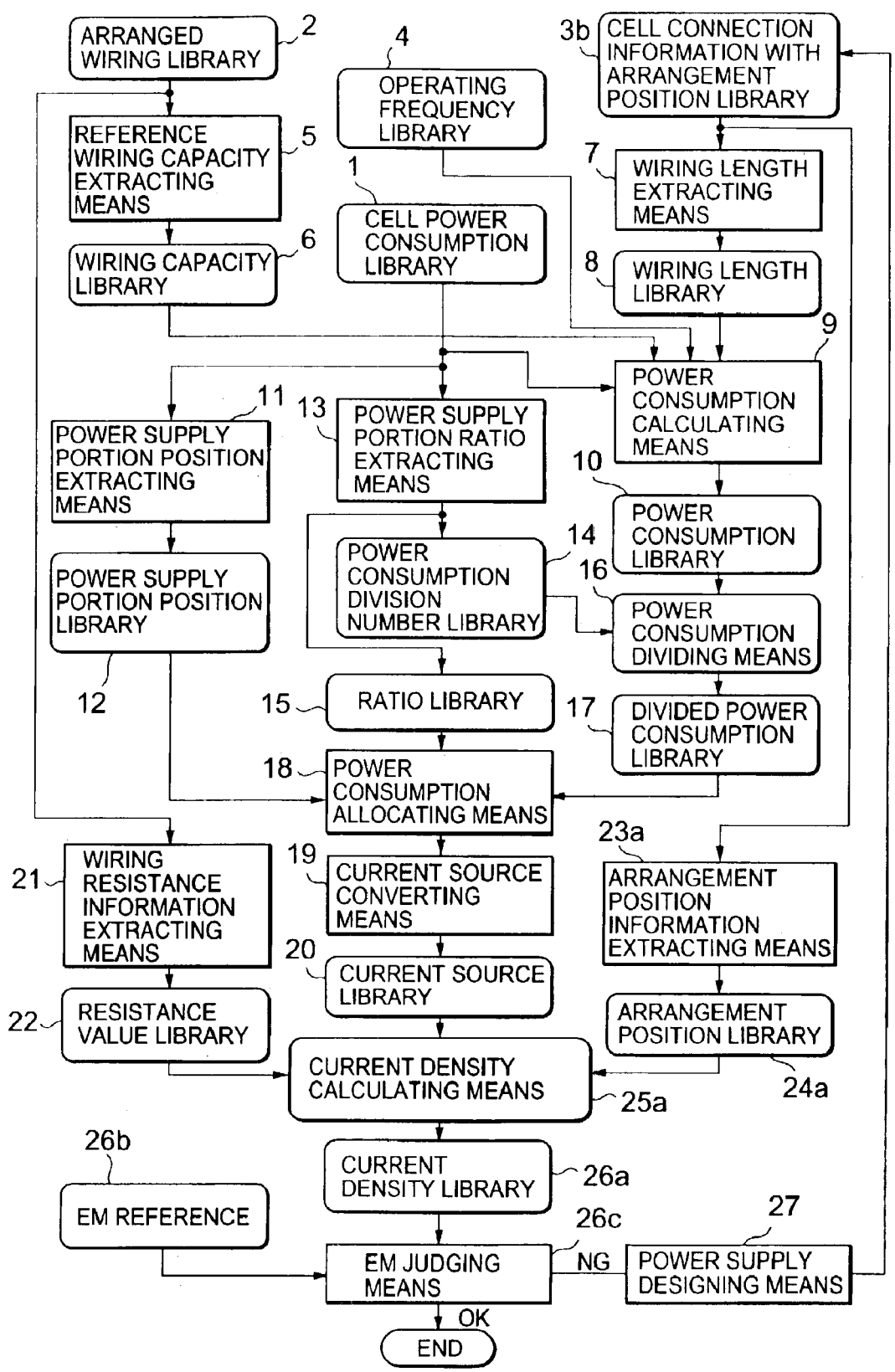
FIG. 8 is a block diagram showing a structure of an EM analysis apparatus of a semiconductor product according to a sixth embodiment of the present invention.

FIG. 8 is a block diagram showing a structure of an EM analysis apparatus for a semiconductor product according to the sixth embodiment of the present invention. In FIG. 8, the EM analysis apparatus for a semiconductor product according to the sixth embodiment of the present invention has arrangement position/wiring information extracting means 23a for extracting arrangement position information of each cell and power supply line width and length of each layer from the cell connection information with arrangement position information library 3b, an arrangement position/wiring library 24a having information of the wiring position of each cell and the power supply line width and length, current density calculating means 25a for calculating a current density of each wiring by using the current source library 20, the resistance value library 22 and the arrangement position/wiring library 24a, a current density library 26a which stores therein the calculated current density of each power supply line, an EM reference 26b which defines an EM reference, and EM judging means 26c for judging whether the EM reference is satisfied by using the current density library 26a and the EM reference 26b.

If the current density exceeds the reference in each power supply line in the EM judging means 26c, the wiring width, the number of vias and others are corrected by the power supply designing means 27. If the current density is not more than the reference, the processing is terminated.

In the EM analysis apparatus for a semiconductor product according to the sixth embodiment of the present invention, any other structure than that described above is the same as the structure of the first embodiment according to the present invention, and like reference numerals denote like or corresponding parts. Also, the operation of the same constituent element is the same as the first embodiment according to the present invention.

Like the sixth embodiment according to the present invention, a seventh embodiment according to the present invention is suitable for a method used in power supply potential fluctuation analysis on a printed circuit having a semiconductor product mounted thereon as well as power supply voltage fluctuation analysis for the inside of a semiconductor product as a method to be used to which the current source defining method according to the present invention is applied.

Figure 9:
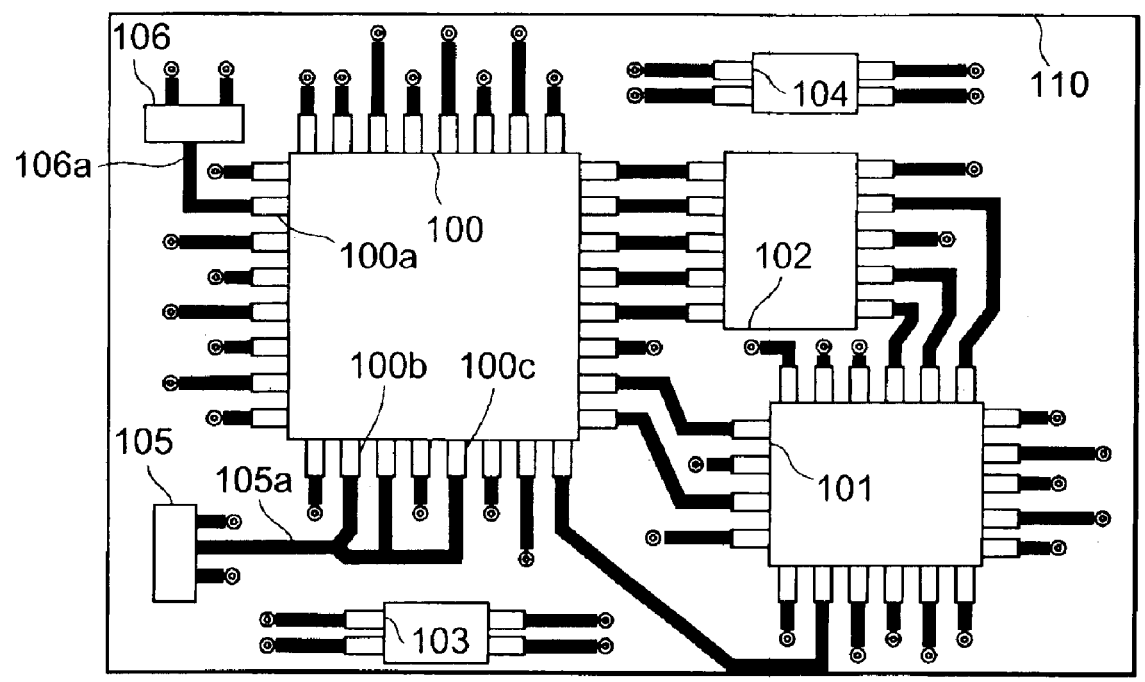
FIG. 9 is a view showing a layout example of a printed board having mounted thereon a plurality of semiconductor products used in a seventh embodiment according to the present invention.

FIG. 9 is a view showing a layout example of a printed board having a plurality of semiconductor products mounted thereon, which is used in the seventh embodiment according to the present invention. In FIG. 9, the printed board 110 has signal control semiconductor products 100, 101, 102, 103 and 104 and power supply semiconductor products 105 and 106.

Additionally, in the signal control semiconductor apparatus 100, two independent power supply voltages are supplied to a power supply terminal 100a (3.3 V) and power supply terminals 100b and 100c (1.2 V) from the power supply semiconductor products 105 (1.2 V) and 106 (3.3 V) through the wirings 105a and 106a on the printed board.

Calculation can be carried out based on the current values and the resistance values supplied through the wirings 105a and 106a in power supply voltage fluctuation analysis on the printed board 110. However, when the power consumption is biased in the signal control semiconductor product 100, values of the currents supplied from the power supply semiconductor product 105 to the power supply terminal 100b and the power supply terminal 100c are different. Therefore, the value of the current supplied from the power supply semiconductor product 105 is not divided into equal parts by using the number of the power supply terminals, but the values of the currents caused to flow though the power supply terminals 100b and 100c are individually defined like the first embodiment of the present invention, thereby enabling application to power supply voltage fluctuation analysis on the printed board 110.

As described above, according to the present invention, when performing power supply voltage fluctuation analysis of a semiconductor product, the power supply structure of the semiconductor product can be optimized by defining the current source in the power supply portion within the function cell of the semiconductor product, thereby reducing a calculation amount and realizing the simple power supply design technique.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A power supply voltage fluctuation analyzing method which performs power supply voltage fluctuation analyzing for a semiconductor product that includes a plurality of function cells, each of said function cells having at least one first common power supply line and at least first and second current sources, each of said first and second current sources being spaced apart from each other and flowing first and second currents therethrough via said first common power supply line, the method comprising:

preparing an input library for each of said plurality of function cells, said input library including first and second position information, said first position information being indicative of a first position of a first current source with respect to said first common power supply line, said second position information being indicative of a second position of a second current source with respect to said first common power supply line, said input library further including current ratio information indicative of a ratio in current between said first and second current sources;

determining a power consumption distribution in each of said function cells of said semiconductor product by using said first and second position information and said current ratio information of said input library; and allocating power consumption to each of said function cells.

2. The method as claimed in claim 1, wherein each of said current sources is MOSFET (Metal Oxide Semiconductor Field Effect Transistor), and each of said first and second positions indicates a source region of said MOSFET of an associated one of said current sources.

3. A The method as claimed in claim 1, wherein said input library is prepared in accordance with an operating state of an associated one of said function cells.

4. The method as claimed in claim 1, wherein each of said function cells further has a second common power supply line, and each of said first and second current sources is connected between said first and second common power supply lines.

5. The power supply fluctuation analyzing method according to claim 1, wherein the input library is an arranged wiring library which stores therein information which defines a capacity value of a resistance value of each wiring layer/via of the semiconductor product.

6. The power supply voltage fluctuation analyzing method according to claim 5, wherein the power supply portion position and the ratio information are written in a coordinate definition portion of the arranged wiring library which includes at least terminal position information and arranged wiring prohibited position information.

7. The power supply voltage fluctuation analyzing method according to claim 1, wherein the input library is a cell connection information with arrangement position information library which stores therein information which defines arrangement position information/circuit connection information of each cell of the semiconductor product.

8. The power supply voltage fluctuation analyzing method according to claim 7, wherein the power supply position and the ratio information are written in a coordinate definition portion of the cell connection information with the arrangement position information library which includes at least arrangement position information in a chip.

9. A power supply voltage fluctuation analyzing method, which performs power supply voltage fluctuation analysis for a semiconductor product, the method comprising a step of determining a power consumption distribution in each function cell of the semiconductor product by using a power supply portion position and a ratio of each portion based on stored information of an input library which stores therein the power supply portion position and ratio information for each function cell of the semiconductor product, and allocating a power consumption to each function cell, wherein the operating state of each cell includes at least a state of an input/output signal, a power supply voltage, a temperature, a frequency, an input waveform deterioration, and a load capacity.

* * * * *